United States Patent
Gong

(10) Patent No.: US 11,282,914 B2
(45) Date of Patent: Mar. 22, 2022

(54) ORGANIC LIGHT-EMITTING DIODE DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jixiang Gong, Wuhan (CN)

( * ) Notice: Subject to any disclaimer, the term of this patent is extended or adjusted under 35 U.S.C. 154(b) by 57 days.

(21) Appl. No.: 16/865,444

(22) Filed: May 4, 2020

(65) Prior Publication Data

US 2021/0210580 A1 Jul. 8, 2021

(51) Int. Cl.
*H01L 27/32* (2006.01)
*H01L 27/12* (2006.01)
*H01L 51/52* (2006.01)

(52) U.S. Cl.
CPC ...... *H01L 27/3276* (2013.01); *H01L 27/1248* (2013.01); *H01L 51/5237* (2013.01)

(58) Field of Classification Search
CPC ............. H01L 27/3276; H01L 27/1248; H01L 51/5237
See application file for complete search history.

(56) References Cited

U.S. PATENT DOCUMENTS 10,211,277 B2 * 2/2019 Lee ...................... H01L 27/3262
2017/0277288 A1 * 9/2017 Choi ..................... G06F 3/0412

* cited by examiner

*Primary Examiner* — Kyoung Lee

(57) ABSTRACT

The invention provides an organic light-emitting diode (OLED) display panel and a display device. Metal wiring is designed into a first metal layer and a second metal layer. The first metal layer is distributed on an edge of a display area and a bending area, the second metal layer is positioned in the bending area, and the second metal layer is disposed opposite to the first metal layer. A part of the first metal layer positioned in the bending area is electrically connected in parallel or in series with the second metal layer to form a double-layer wiring or a double-layer wiring exchange structure. After any one of the metal layers breaks, the other metal layer can still be used to maintain signal transmission.

9 Claims, 8 Drawing Sheets

ORGANIC LIGHT-EMITTING DIODE DISPLAY PANEL AND DISPLAY DEVICE

The present application claims priority to Chinese patent application filed in China on Jan. 6, 2020, having application No. 202010010692.3, which is incorporated by reference in the present application in its entirety.

FIELD OF INVENTION

The present invention relates to the field of display technology, and in particular, to an organic light-emitting diode display panel and a display device.

BACKGROUND OF INVENTION

Organic light-emitting diode (OLED) display panels have gradually become a new generation of display technology due to their high contrast, wide color gamut, low power consumption, and foldability. Compared with liquid crystal display (LCD) technology, the OLED display panels can be applied to flexible display panels. Particularly, a lower bezel of the panels can be bent to a rear side of the panels to achieve a purpose of narrow border.

In a conventional OLED display panel, power supply wirings connecting drain electrodes of adjacent driving thin-film transistors (TFTs) adopt straight metal wirings, which easily crack and lead to excessively high local resistance and even result in disconnection of the wirings, thereby affecting use of the display. In order to reduce stress on the metal wirings in a bending area, counterbores are formed in the bending area and an organic insulating material is filled in the counterbores to form two bumps on a surface of an organic insulating layer. When power supply wirings are laid on the surface of the organic insulating layer, the bumps will affect connection stability of the power supply wirings, scan wirings, and data wirings, and further affect stability of a TFT device and display quality of the display panel.

Therefore, in the prior art, the power supply wirings connected to source/drain in the bending area of the OLED panel are prone to breakage, while connection of the power supply wirings, scan wirings, and data wirings is unstable, thereby affecting stability of the TFT device and display quality of the display panel. These technical problems need to be relieved.

Technical Problem

The invention provides an organic light-emitting diode (OLED) display panel and a display device, which can solve problems of power supply wiring connected to source/drain in a bending area of the OLED panel in the prior art being prone to breakage and unstable connection of the power supply wirings, scan wirings, and data wirings. These problems affect stability of TFT devices and display quality of the display panel.

SUMMARY OF INVENTION

To solve the above problems, the technical solution provided by the present invention is as follows:

The present invention provides an organic light-emitting diode (OLED) display panel including a substrate, a thin-film transistor (TFT) layer disposed on one side of the substrate, a light-emitting layer disposed on the TFT layer, and an encapsulation layer covering the light-emitting layer. The OLED display panel has a display area and a bending area on one side of the display area, wherein a first metal layer, a second metal layer, and a dielectric layer between the first metal layer and the second metal layer are disposed on the TFT layer corresponding to the bending area, and a partial region of the first metal layer is electrically connected to the second metal layer. According to a preferred embodiment of the present invention, a counterbore is disposed between the first metal layer and the substrate, and the counterbore is filled with organic insulating material.

According to a preferred embodiment of the present invention, the second metal layer is opposite to the first metal layer, and the second metal layer is electrically connected to the first metal layer through a via-hole in the dielectric layer.

According to a preferred embodiment of the present invention, the first metal layer includes a plurality of first sub-metal layers disposed separately, the second metal layer includes a plurality of second sub-metal layers disposed separately, each of the second sub-metal layers is respectively opposite to an interval between correspondingly adjacent first sub-metal layers, and each of the second sub-metal layers is respectively electrically connected to the correspondingly adjacent first sub-metal layers through a via-hole in the dielectric layer.

According to a preferred embodiment of the present invention, the first metal layer and a source/drain of the display area are positioned in the same layer, the second metal layer and a second gate or a first gate of the display area are positioned in the same layer, and the dielectric layer is an organic insulating material.

According to a preferred embodiment of the present invention, the first metal layer and the first gate are positioned in the same layer, the second metal layer and the second gate are positioned in the same layer, and the dielectric layer is an organic insulating material.

According to a preferred embodiment of the present invention, the first metal layer is disposed on a neutral plane with minimal bending stress when bending, formed by the substrate and the encapsulation layer in the bending area.

According to a preferred embodiment of the present invention, the display area close to the bending area is provided with a first connection block and a second connection block, the first connection block and the second connection block are electrically connected to the first metal layer, respectively, and wherein the first connection block and the first gate are positioned in the same layer, and the second connection block and the second gate are positioned in the same layer.

According to the OLED display panel, the present application further provides a display device that includes the OLED display panel and a back panel attached to the OLED display panel.

Beneficial Effect

Beneficial effects of the present invention are:
The invention provides an organic light-emitting diode (OLED) display panel, in which a metal wiring is designed into a first metal layer and a second metal layer. The first metal layer is distributed on an edge of a display area and a bending area, the second metal layer is positioned in the bending area, and a part of the first metal layer positioned in the bending area is electrically connected in parallel or in series with the second metal layer to form a double-layer wiring or a double-layer wiring exchange structure. After any one of the first metal layer or the second metal layer breaks, the other metal layer can still be used to maintain signal transmission, which reduces a risk of signal transmission failure caused by long-term bending of signal wiring. This can improve yield of the OLED display panel while solving a problem of unstable connection of power supply wirings, scan wirings, and data wirings in the bending area. Therefore, stability of a TFT device and display quality of the display panel are improved.

DESCRIPTION OF DRAWINGS

In order to explain the technical solution in the embodiment or the prior art more clearly, the drawings used in the description of the embodiment or the prior art will be briefly introduced below. Obviously, the drawings in the following description are only some embodiments of the invention. For those of ordinary skill in the art, other drawings can be obtained according to these drawings without doing the creative activity.

DETAILED DESCRIPTION OF PREFERRED EMBODIMENTS

Figure 1:
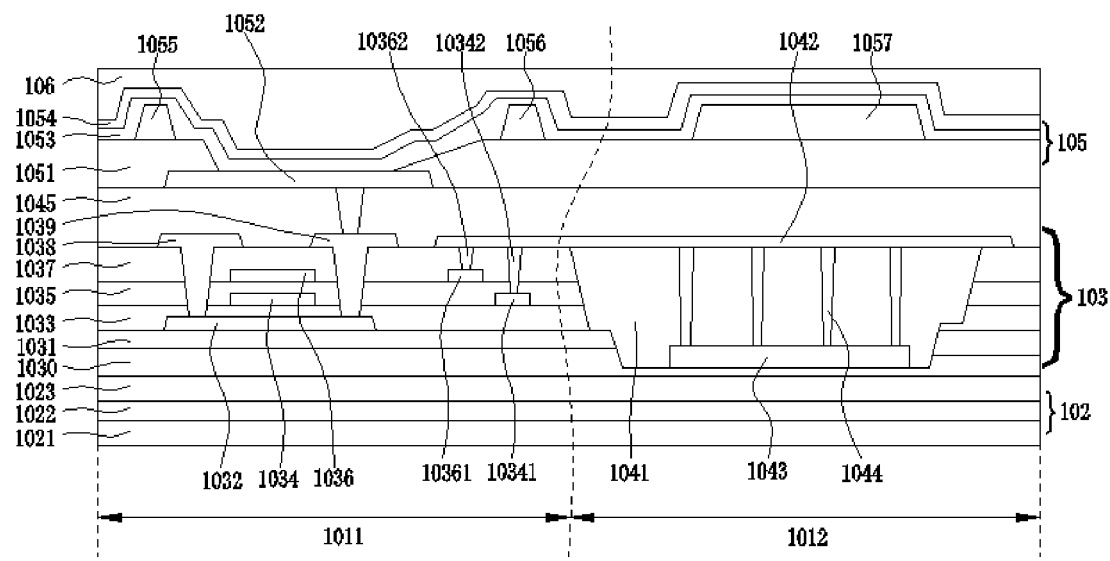
FIG. 1 is a first schematic structural diagram of an organic light-emitting diode (OLED) display panel according to an embodiment of the present application.

The following descriptions of the embodiments are made with reference to drawings to illustrate specific embodiments that can be implemented by the present invention. The directional terms mentioned in the present invention, such as "up", "down", "front", "rear", "left", "right", "inside", "outside", "side", etc. are only directions referring to the drawings. Therefore, the directional terms used are for explaining and understanding the present invention, but not for limiting the present invention. In the drawings, units with similar structures are indicated by the same reference numerals, and the dotted wirings in the drawings only illustrate the shape and position of the structure.

An embodiment of the present application provides an organic light-emitting diode (OLED) display panel, including a substrate, a thin-film transistor (TFT) layer disposed on one side of the substrate, a light-emitting layer disposed on the TFT layer, and an encapsulation layer covering the light-emitting layer. The OLED display panel includes a display area and a bending area positioned on one side of the display area; wherein a first metal layer, a second metal layer, and a dielectric layer between the first metal layer and the second metal layer are disposed on the TFT layer corresponding to the bending area, and a partial region of the first metal layer is electrically connected to the second metal layer.

As shown in FIG. 1, an embodiment of the present application provides a first schematic structural diagram of an OLED display panel, including a substrate 102, a TFT layer 103 disposed on one side of the substrate 102, a light-emitting layer 105 disposed on the TFT layer 103, and an encapsulation layer 106 covering the light-emitting layer 105. The OLED display panel has a display area 1011 and a bending area 1012 positioned on one side of the display area 1011. The substrate 102 includes a first organic flexible layer 1021, a water vapor barrier layer 1022, and a second organic flexible layer 1023. Materials of the first organic flexible layer 1021 and the second organic flexible layer 1023 are preferably composite selected from one or more of acrylic, hexamethyldisiloxane, polyacrylate, polycarbonate, and polystyrene. The water vapor barrier layer 1022 is an inorganic material thin-film, and a material of the water vapor barrier layer 1022 is composite selected from one or more of $Al_2O_3$, $TiO_2$, $SiN_x$, $SiCN_x$, and $SiO_x$. The light-emitting layer 105 includes an anode 1052, a pixel definition layer 1051 positioned on both sides of the anode 1052, a light-emitting unit layer 1053 positioned on the anode 1052, and a cathode layer 1054 positioned on the light-emitting unit layer 1053. The pixel definition layer 1051 is separated to form a pixel opening. Both sides of each pixel opening are provided with a spacer 1055 and a spacer 1056, the spacer 1055 and the spacer 1056 are used to support the light-emitting layer 105, and the anode 1052 is in electrical contact with a drain in a driving transistor through an anode via-hole. A source of the driving transistor is connected to a positive electrode of an external power source, and a flexible printed circuit board is attached with a corresponding driving chip. A negative electrode of the external power supply transmits a corresponding electrical signal to a power supply wiring layer through a bonding area, and finally, the power supply wiring layer transmits the corresponding electrical signal to the cathode layer 1054. When the positive electrode and negative electrode of the external power supply are applied with an appropriate DC voltage, holes are generated in the anode layer 1052, electrons are generated in the cathode layer 1054, and they meet in the light-emitting unit layer 1053. The electrons and holes are negatively and positively charged, respectively, and they attract each other to excite an organic material in the light-emitting unit layer 1053 to emit light, thereby achieving normal operation of the OLED display panel 100. By controlling a magnitude of the external power supply voltage, a brightness of the light-emitting layer 105 can be adjusted. The greater the voltage, the higher the brightness, and conversely, the darker. When the voltage is input, the holes in the anode 1052 and charges in the cathode layer 1054 will be combined in the light-emitting unit layer 1053 to emit light. Based on different formulas, three primary colors of red, green, and blue (R, G, B) can be generated to constitute basic colors.

The TFT layer 103 corresponding to the display area 1011 is provided with a light-shielding layer 1030 positioned on the substrate 102, a buffer layer 1031 positioned on the light-shielding layer 1030, an active layer 1032 positioned on the buffer layer 1031, a first gate insulating layer 1033 positioned on the active layer 1032, a first gate 1034 positioned on the first gate insulating layer 1033, a second gate insulating layer 1035 positioned on the first gate 1034, a second gate 1036 positioned on the second gate insulating layer 1035, an interlayer insulating layer 1037 positioned on the second gate 1036, a source 1038 and a drain 1039 positioned on the interlayer insulating layer 1037, and a planarization layer 1045 positioned on the source 1038 and drain 1039.

The TFT layer 103 corresponding to the bending area 1012 is provided with a counterbore 1041 on the substrate 102. The counterbore 1041 is positioned on a surface of the buffer layer 1031. The buffer layer 1031 at this position has a thickness of 200 nm. A second metal layer 1043 is deposited on the bottom of the counterbore 1041, and the counterbore 1041 is filled with an organic insulating material. The organic insulating material is flush with the interlayer insulating layer, and the organic insulating material is provided with four via-holes 1044. In the embodiment, the specific number of via-holes 1044 is not limited. A first metal layer 1042 is tiled on a surface of the organic insulating material. The first metal layer 1042 is disposed on the same layer as the source 1038 and the drain 1039 and they are completed in the same process. The second metal layer 1043 is electrically connected in parallel with the first metal layer 1042 through the via-holes 1044 to form a double-layer wiring structure. After any one of the first metal layer 1042 or the second metal layer 1043 breaks, the other metal layer can still maintain signal transmission, which reduces the risk of signal transmission failure caused by long-term bending of the signal wiring and thereby improves the yield of the OLED display panel. In this embodiment, three, four, five, or more metal layers can also be arranged in parallel to reduce the risk of breakage of signal wiring.

The first metal layer 1042 is disposed opposite to the second metal layer 1043, one end of the first metal layer 1042 extends to the display area 1011, and the display area 1011 close to the bending area 1012 is provided with a first connection block 10341 and a second connection block 10361. The first connection block 10341 and the second connection block 10361 are electrically connected to the first metal layer 1042 through a via-hole 10342 and a via-hole 10362, respectively. The first metal layer 1042 and the second metal layer 1043 each include a plurality of metal signal wirings. A material of the metal signal wirings is preferably one or more of silver, copper, aluminum, molybdenum, and titanium, and adjacent signal wirings are provided with a shielding structure so as to not interfere with each other, wherein the first connection block 10341 is disposed on the same layer as the first gate 1034, and the second connection block 10361 is disposed on the same layer as the second gate 1036. Therefore, the first metal layer 1042 and the second metal layer 1043 can be used as a power supply wiring between a power source and a source/drain, and can also be used as a data wiring or a scan wiring, which solves the problem of unstable connection of power wirings, scan wirings, and data wirings in the bending area. In this embodiment, an organic film layer 1057 is provided above the position of the pixel definition layer 1051 corresponding to the bending area 1012. By depositing organic film layers 1057 of different thicknesses, the first metal layer 1042 is disposed on the neutral surface between the substrate 102 and the encapsulation layer 106 in the bending area 1012. When bending, the first metal layer 1042 is subjected to minimum bending stress, which reduces the risk of breakage of the first metal layer.

Figure 2:
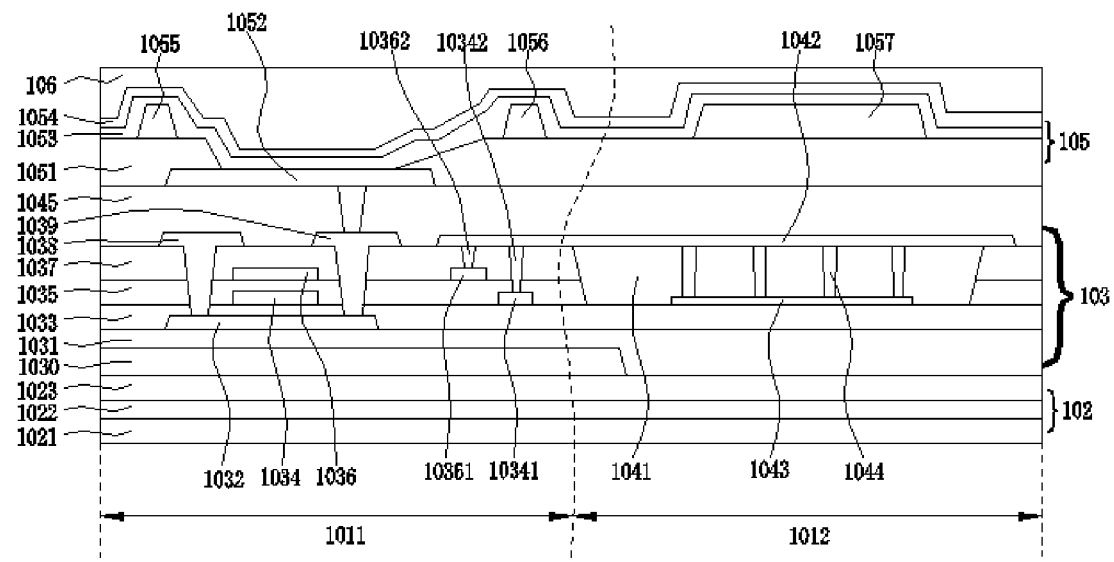
FIG. 2 is a second schematic structural diagram of an OLED display panel according to an embodiment of the present application.

As shown in FIG. 2, an embodiment of the present application provides a schematic diagram of a second structure of an OLED display panel. The first sub-metal layer 1042 is disposed on the same layer as the source 1038 and the drain 1039, the counterbore 1041 is positioned on a surface of the first gate insulating layer 1033, and a second metal layer 1043 is deposited on the bottom of the counterbore 1041. The second metal layer 1043 is disposed on the same layer as the first gate, and the counterbore 1041 is filled with organic insulating material. The organic insulating material is flush with the interlayer insulating layer, and four via-holes 1044 are provided in the organic insulating material, wherein the specific number of via-holes 1044 is not limited in the embodiment. The first metal layer 1042 is tiled on a surface of the organic insulating material, and the first metal layer 1042 is disposed on the same layer as the source 1038 and the drain 1039. The second metal layer 1043 is electrically connected in parallel with the first metal layer 1042 through the via-holes 1044 to form a double-layer wiring structure. After any one of the first metal layer 1042 or the second metal layer 1043 breaks, the other metal layer can still maintain signal transmission, which reduces the risk that the signal wiring cannot be transmitted due to breakage caused by long-term bending.

In this embodiment, the counterbore 1041 may also be positioned on a surface of the second gate insulating layer. A second metal layer 1043 is deposited on the bottom of the counterbore 1041, the second metal layer 1043 is disposed on the same layer as the second gate, and the other structures are similar to those of FIG. 1 and will not be repeated herein.

Figure 3:
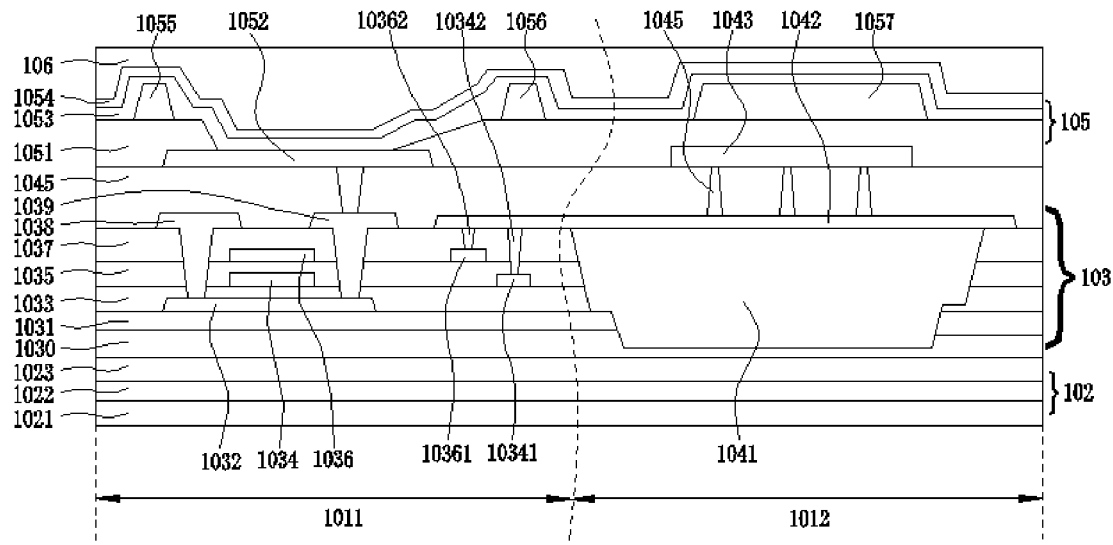
FIG. 3 is a third schematic structural diagram of an OLED display panel according to an embodiment of the present application.

As shown in FIG. 3, a third structural diagram of an OLED display panel is provided in an embodiment of the present application. The first sub-metal layer 1042 is disposed on the same layer as the source 1038 and the drain 1039. The counterbore 1041 is positioned between the substrate 102 and the planarization layer 1045, the counterbore 1041 is filled with an organic insulating material to buffer the bending stress, and the first metal layer 1042 is disposed on the same layer as the source 1038 and the drain 1039. The second metal layer 1043 is disposed on a surface of the planarization layer 1045, the second metal layer 1043 is disposed on the same layer as the anode 1052, and three via-holes 1044 are provided in the planarization layer 1045.

The specific number of via-holes 1044 in this embodiment is not limited. The second metal layer 1043 is electrically connected in parallel with the first metal layer 1042 through the via-holes 1044 to form a double-layer wiring structure. After any one of the first metal layer 1042 or the second metal layer 1043 breaks, the other metal layer can still be used to maintain signal transmission, which reduces the risk that the signal wiring cannot be transmitted due to breakage caused by long-term bending and thereby improves the yield of the OLED display panel. The other structures are similar to those in FIG. 1 and will not be repeated herein.

Figure 4:
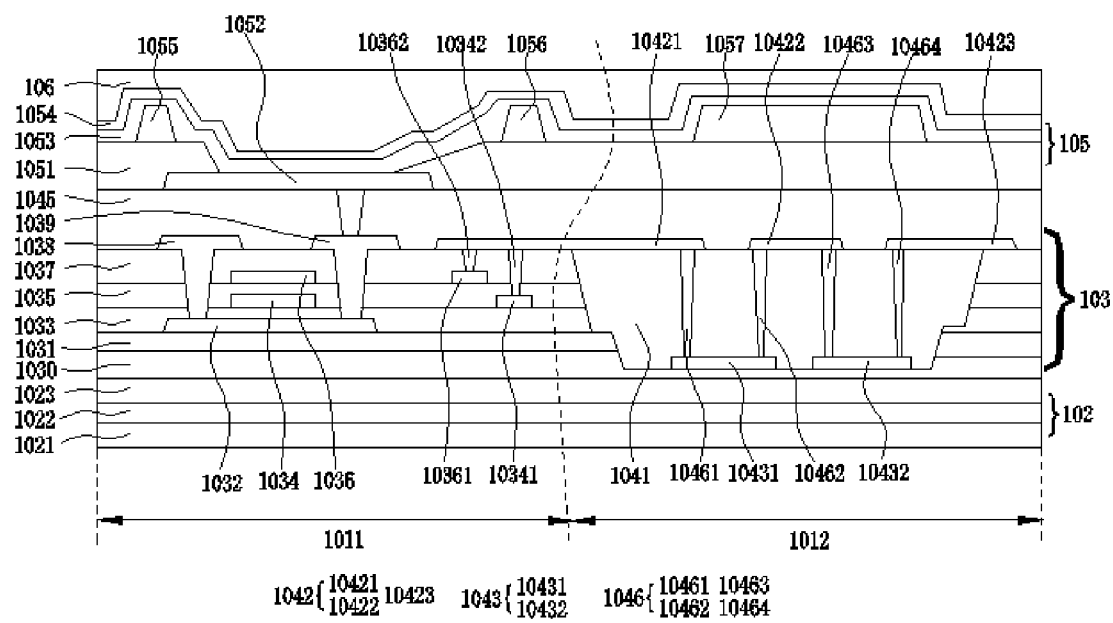
FIG. 4 is a fourth schematic structural diagram of an OLED display panel according to an embodiment of the present application.

As shown in FIG. 4, an embodiment of the present application provides a fourth structural schematic diagram of an OLED display panel. The first metal layer 1042 includes a plurality of first sub-metal layers disposed separately. The second metal layer 1043 shown includes a plurality of second sub-metal layers disposed separately. Each second sub-metal layer is respectively opposite to an interval between the corresponding two adjacent first sub-metal layers, and each second sub-metal layer is electrically connected to the corresponding two adjacent first sub-metal layers through via-holes in the dielectric layer to form a double-layer wiring exchange structure, thereby reducing the risk of signal wiring breakage due to long-term bending, and preventing the signal transmission failure.

Specifically, the first metal layer 1042 includes a first sub-metal layer 10421, a first sub-metal layer 10422, and a first sub-metal layer 10423 which are separately disposed. The second metal layer 1043 includes a second sub-metal layer 10431 and a second sub-metal layer 10432 which are separately disposed, wherein the first sub-metal layer 1042 is disposed on the same layer as the source 1038 and the drain 1039. The TFT layer 103 corresponding to the bending area 1012 is provided with a counterbore 1041 on the substrate 102. The counterbore 1041 is positioned on a surface of the buffer layer 1031. The buffer layer 1031 at this position has a thickness of 200 nm, a second metal layer 1043 is deposited on the bottom of the counterbore 1041, and the counterbore 1041 is filled with organic insulating material. The organic insulating material is flush with the interlayer insulating layer, and the organic insulating material is provided with a via-hole 1046, and the second metal layer 1043 is electrically connected to the first metal layer 1042 through the via-hole 1046. The via-hole 1046 includes via-hole 10461, via-hole 10462, via-hole 10463, and via-hole 10464. The second metal layer 1043 includes a second sub-metal layer 10431, a second sub-metal layer 10432, and a second sub-metal layer 10431. The second sub-metal layer 10432 and the buffer layer 1031 are positioned in the same layer, and the second sub-metal layer 10431 is positioned between the first sub-metal layer 10421 and the first sub-metal layer 10422. The second sub-metal layer 10431 is electrically connected to the first sub-metal layer 10421 and the first sub-metal layer 10422 through via-holes 10461 and 10462 on both sides, respectively. The second sub-metal layer 10432 is positioned between the first sub-metal layer 10422 and the first sub-metal layer 10423, the second sub-metal layer 10432 is electrically connected to the first sub-metal layer 10422 and the first sub-metal layer 10423 through the via-hole 10463 and the via-hole 10464 on both sides, respectively. The first metal layer 1042 and the second metal layer 1043 are electrically connected in series through the via-hole 1046 to form a double-layer wiring exchange structure, which reduces the risk of signal transmission failure caused by long-term bending of the signal wiring and improves the yield of the OLED display panel. The other structures are similar to those in FIG. 1 and will not be repeated herein.

Figure 5:
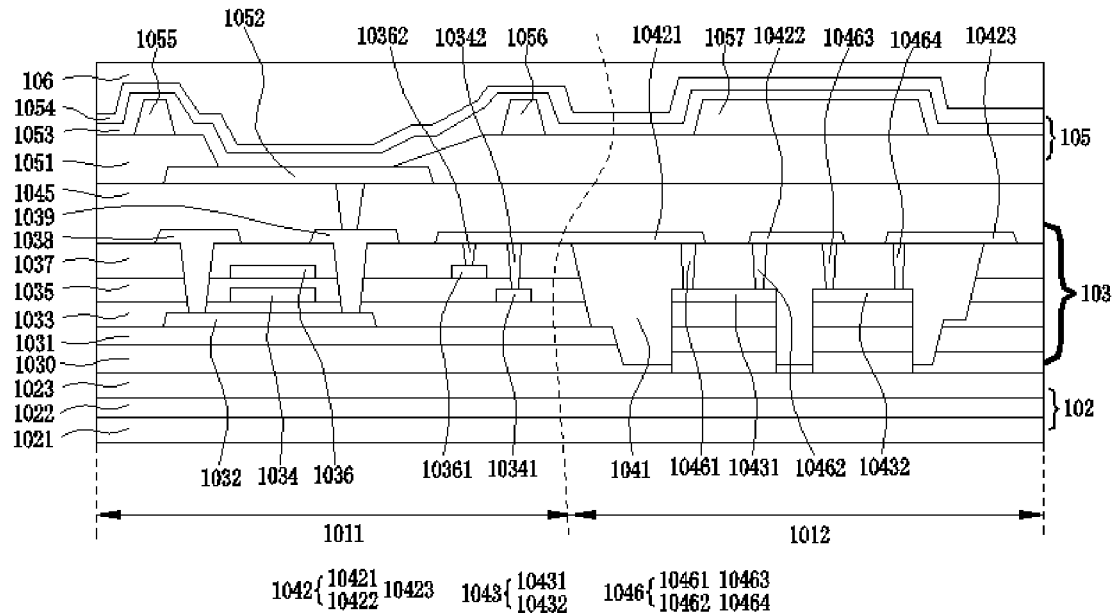
FIG. 5 is a fifth schematic structural diagram of an OLED display panel according to an embodiment of the present application.

As shown in FIG. 5, an embodiment of the present application provides a fifth structural schematic diagram of an OLED display panel. In this embodiment, the first sub-metal layer 1042 is disposed on the same layer as the source 1038 and the drain 1039, and the second sub-metal layer 10431 and the second sub-metal layer 10432 are disposed on the same layer as the first gate. A first gate insulation 1033 and a buffer layer 1031 are disposed under the second sub-metal layer 10431 and the second sub-metal layer 10432, the second sub-metal layer 10431 is positioned between the first sub-metal layer 10421 and the first sub-metal layer 10422, and the second sub-metal layer 10431 is electrically connected to the first sub-metal layer 10421 and the first sub-metal layer 10422 through via-holes 10461 and 10462 on both sides, respectively. The second sub-metal layer 10432 is positioned between the first sub-metal layer 10422 and the first sub-metal layer 10423, and the second sub-metal layer 10432 is electrically connected to the first sub-metal layer 10422 and the first sub-metal layer 10423 through via holes 10463 and 10464 on both sides, respectively. The first metal layer 1042 and the second metal layer 1043 are electrically connected in series through the via-hole 1046 to form a double-layer wiring exchange structure, which reduces the risk that signals cannot be transmitted due to breakage of signal wiring caused by long-term bending, and improves the yield of the OLED display panel. The other structures are similar to those in FIG. 4 and will not be repeated herein.

In this embodiment, the counterbore 1041 can also be positioned on a surface of the second gate insulating layer 1035. A second metal layer 1043 is deposited on the bottom of the counterbore 1041, and the second metal layer 1043 is disposed on the same layer as the second gate 1036. The other structures are similar to those in FIG. 1 and will not be repeated herein.

Figure 6:
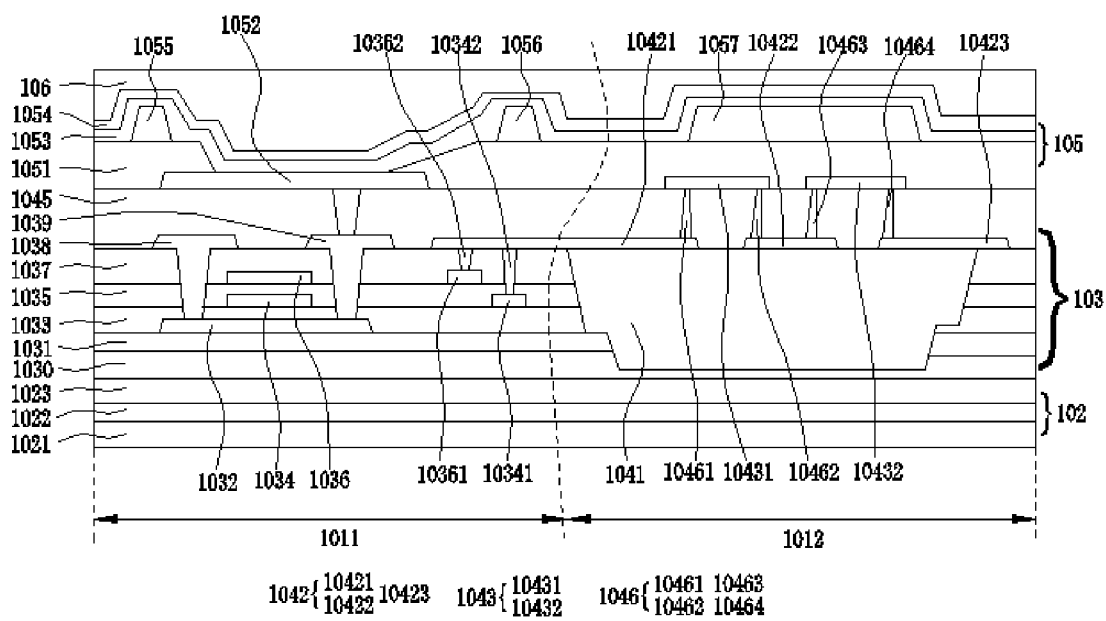
FIG. 6 is a sixth schematic structural diagram of an OLED display panel according to an embodiment of the present application.

As shown in FIG. 6, an embodiment of the present application provides a sixth structural schematic diagram of an OLED display panel. In this embodiment, the first sub-metal layer 1042 is disposed on the same layer as the source 1038 and the drain 1039. The counterbore 1041 is positioned between the substrate 102 and the planarization layer 1045. The counterbore 1041 is filled with organic insulating material for buffering the bending stress. The first metal layer 1042 is disposed on the same layer as the source 1038 and the drain 1039, the second metal layer 1043 is disposed on a surface of the planarization layer 1045, and the second metal layer 1043 is disposed on the same layer as the anode 1052, and the planarization layer 1045 is provided with four via-holes 1046. The specific number of via-holes 1046 in this embodiment is not limited, and the second sub-metal layer 10431 is positioned between the first sub-metal layer 10421 and the first sub-metal layer 10422. The second sub-metal layer 10431 is electrically connected to the first sub-metal layer 10421 and the first sub-metal layer 10422 through via-holes 10461 and 10462 on both sides, respectively. The second sub-metal layer 10432 is positioned between the first sub-metal layer 10422 and the first sub-metal layer 10423, and the second metal layer 1043 is electrically connected in series with the first metal layer 1042 through the via-holes 1046 to form a double-layer wiring exchange structure. It reduces the risk of signal transmission failure caused by long-term bending and breakage of the signal wiring, thereby improving the yield of the OLED display panel. The other structures are like those in FIG. 5 and will not be repeated herein.

In addition, in this embodiment, the first sub-metal layer 1042 is disposed on the same layer as the first gate 1034, and the second metal layer 1043 is disposed on the same layer as the second gate 1036; alternatively, the first sub-metal layer 1042 is disposed on the same layer as the first gate 1034 or the second gate 1036, and the second metal layer 1043 is disposed on the same layer as the anode 1052; alternatively, the first sub-metal layer 1042 is disposed on the same layer as the buffer layer 1031, and the second metal layer 1043 is disposed on the same layer as the source 1038 and the drain 1039 or the anode 1052. For other structures, please refer to FIG. 1 to FIG. 6.

According to the objective of the present invention, a display device including the OLED display panel and a back panel attached to the back of the OLED display panel is provided.

The display device provided in the embodiment of the present application uses the first metal layer and the second metal layer to be electrically connected in parallel or in series. It can solve the problem that signals cannot be transmitted due to breakage of signal wiring caused by long-term bending, as well as the problem of unstable connection of power wirings, scan wirings, and data wirings in the bending area.

Figure 7:
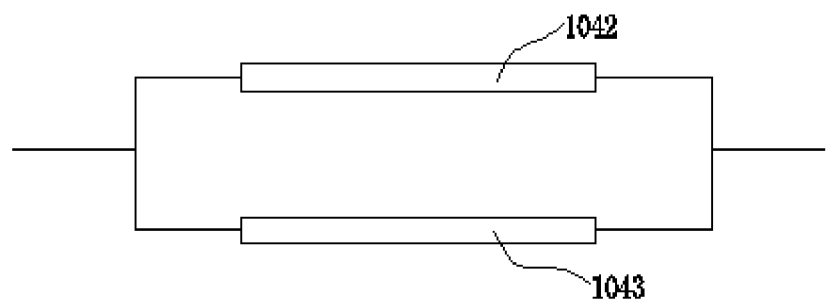
FIG. 7 is a schematic diagram of a parallel equivalent circuit of a first metal layer and a second metal layer in an OLED display device according to an embodiment of the present application.
Figure 8:
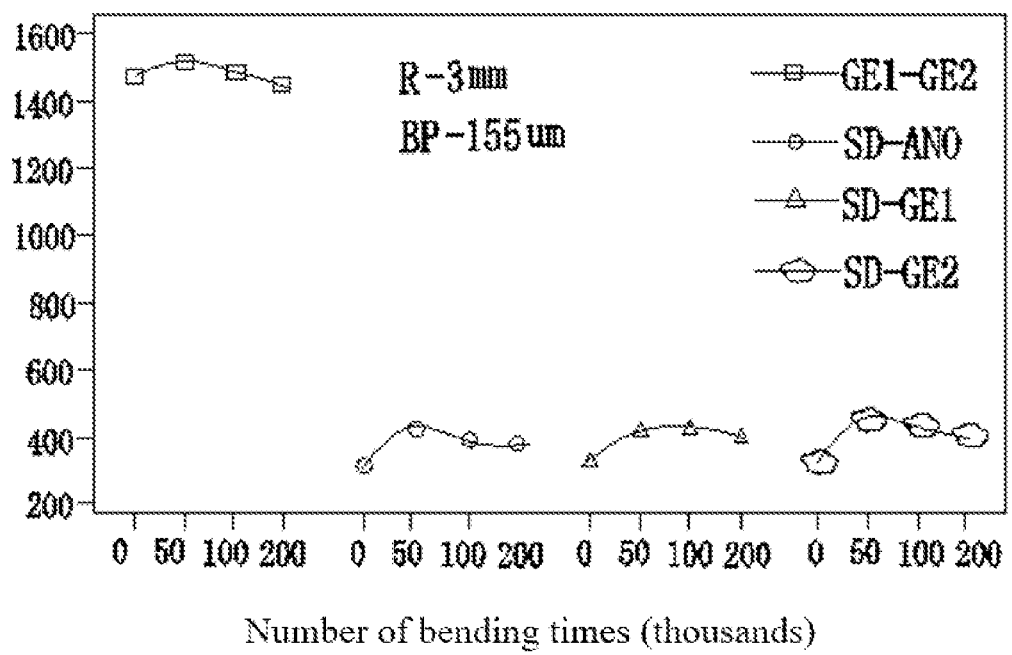
FIG. 8 is a schematic diagram showing a relationship between a number of bending times of a display device and an impedance of a double-layer wiring structure according to an embodiment of the present application.
Figure 9:
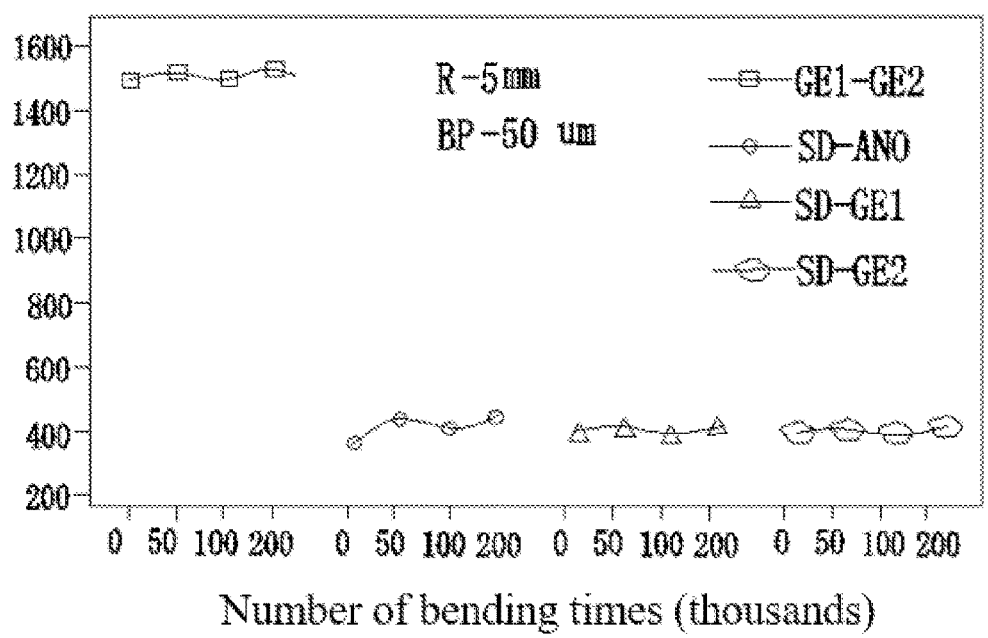
FIG. 9 is a schematic diagram showing a relationship between a number of bending times of another display device and an impedance of a double-layer wiring structure according to an embodiment of the present application.
Figure 10:
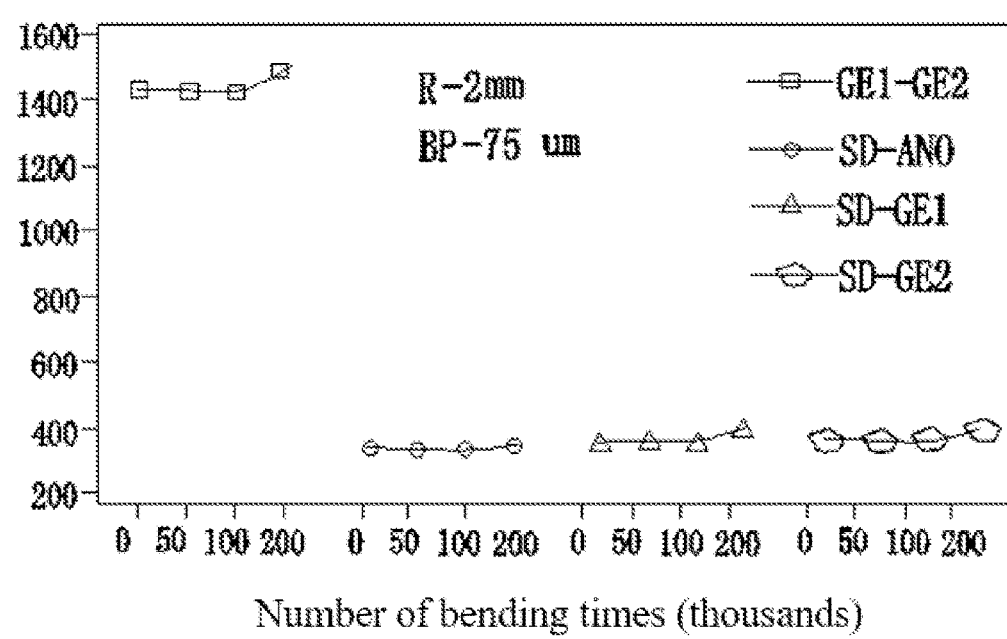
FIG. 10 is a schematic diagram showing a relationship between a number of bending times of yet another display device and an impedance of a double-layer wiring structure according to an embodiment of the present application.

As shown in FIG. 7, the first metal layer 1042 and the second metal layer 1043 are connected in parallel to form a double-layer wiring structure. FIG. 8, FIG. 9, and FIG. 10 represent experiments performed when the first metal layer and the second metal layer are electrically connected in parallel, wherein GE1-GE2 in FIG. 8, FIG. 9, and FIG. 10 represent that in the bending area, the first metal layer 1042 is disposed in the same layer as the first gate, and the second metal layer 1043 is disposed in the same layer as the second gate. SD-ANO represents that in the bending area, the first metal layer 1042 is disposed in the same layer as the source and the drain, and the second metal layer 1043 is disposed in the same layer as the anode. SD-GE1 represents that in the bending area, the first metal layer 1042 is disposed in the same layer as the source and drain, and the second metal layer 1043 is disposed in the same layer as the first gate. SD-GE2 represents that in the bending area, the first metal layer 1042 is disposed in the same layer as the source and drain, and the second metal layer 1043 is disposed in the same layer as the second gate. BP represents the back panel, and R represents a radius of bending toward the substrate along a certain center line in the bending area. Comparing FIG. 8, FIG. 9, and FIG. 10, GE1-GE2 is the most stable, followed by SD-GE1 and SD-GE2, and the worst is SD-ANO.

Figure 11:
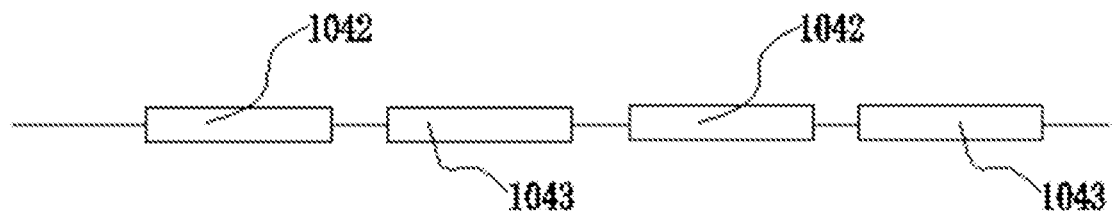
FIG. 11 is a schematic diagram of a series equivalent circuit of a first metal layer and a second metal layer in a display device according to an embodiment of the present application.
Figure 12:
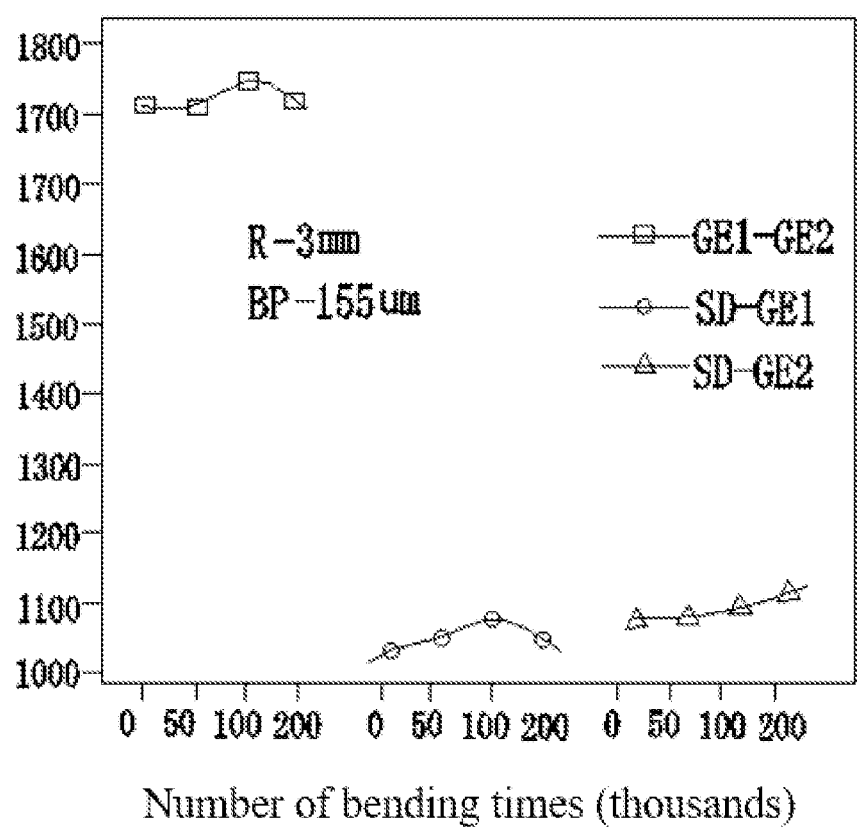
FIG. 12 is a schematic diagram showing a relationship between a number of bending times of a display device and an impedance of a double-layer wiring exchange structure according to an embodiment of the present application.
Figure 13:
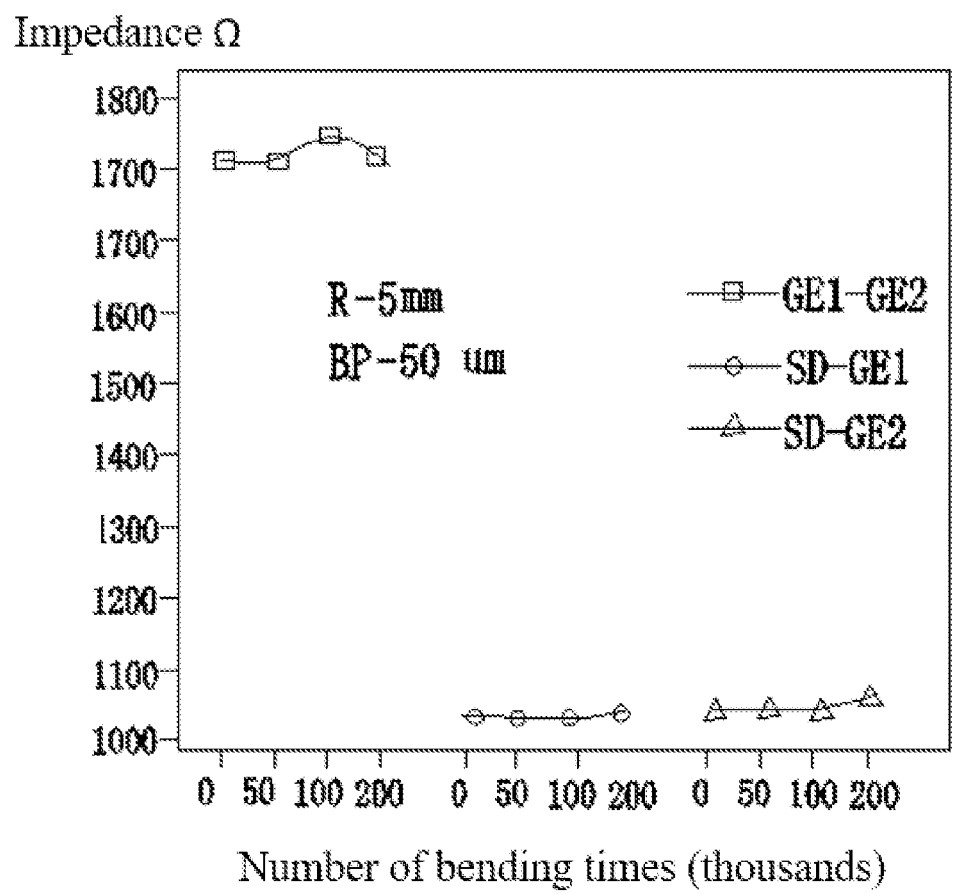
FIG. 13 is a schematic diagram showing a relationship between a number of bending times of another display device and an impedance of a double-layer wiring exchange structure according to an embodiment of the present application.
Figure 14:
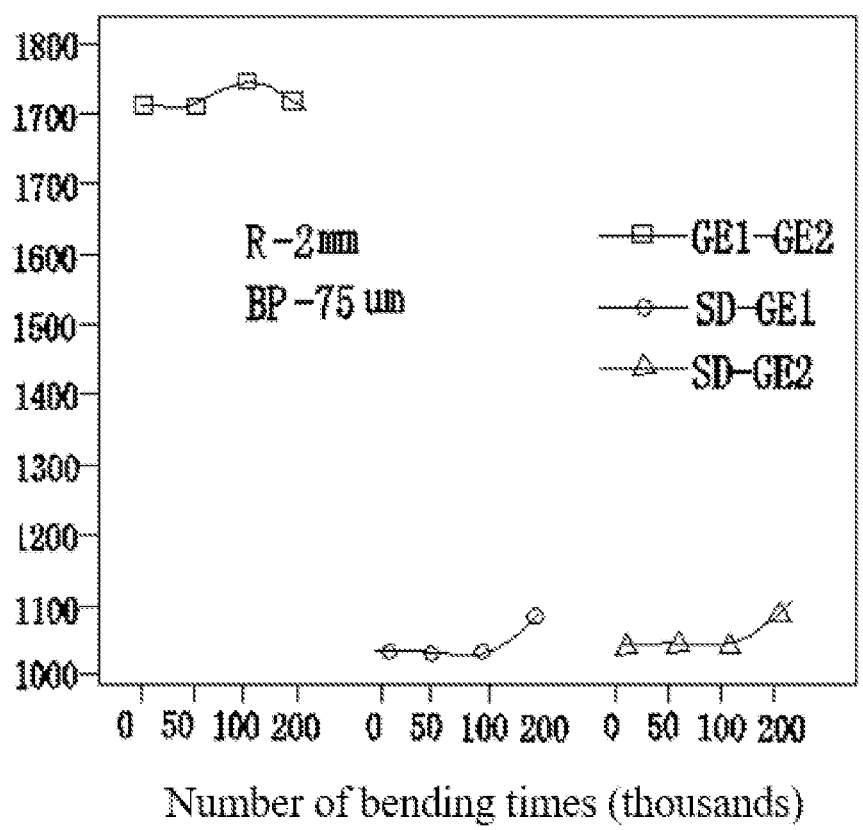
FIG. 14 is a schematic diagram showing a relationship between a number of bending times of yet another display device and an impedance of a double-layer wiring exchange structure according to an embodiment of the present application.

As shown in FIG. 11, the first metal layer 1042 and the second metal layer 1043 are connected in series to form a double-layer wiring exchange structure. FIG. 12, FIG. 13, and FIG. 14 represent experiments performed when the first metal layer 1042 and the second metal layer 1043 are electrically connected in series, wherein GE1-GE2 in FIG. 12, FIG. 13, and FIG. 14 represent that in the bending area, the first metal layer 1042 is disposed in the same layer as the first gate, and the second metal layer 1043 is disposed in the same layer as the second gate. SD-GE1 represents that in the bending area, the first metal layer 1042 is disposed in the same layer as the source and drain, and the second metal layer 1043 is disposed in the same layer as the first gate. SD-GE2 represents that in the bending area, the first metal layer 1042 is disposed on the same layer with the source and drain electrodes, and the second metal layer 1043 is disposed on the same layer with the second gate electrode. BP represents the back panel, and R represents a radius of bending toward the substrate along a center line in the bending area. Comparing FIG. 12, FIG. 13, and FIG. 14, GE1-GE2 is the most stable, followed by SD-GE1 and SD-GE2.

Comparing FIG. 8, FIG. 9, FIG. 10, FIG. 12, FIG. 13, and FIG. 14, the first metal layer and the second metal layer are electrically connected in parallel or in series, which has an effect of preventing breakage of the metal wiring during the bending process and achieves an effect of reinforcing the metal wiring. The double-layer wiring exchange structure consisting of GE1 and GE2 is the most stable, followed by the double-layer wiring exchange structure consisting of SD-GE. The double-layer wiring consisting of GE1 and GE2 requires more photomasks in the manufacturing processes and is not easy to be placed in the bending area. Therefore, it is ideal to choose the double-layer exchange wiring consisting of SD-GE, that is, the first metal layer 1042 is disposed in the same layer as the source and drain, and the second metal layer 1043 is disposed in the same layer as the first gate or the second gate.

The beneficial effects of the present invention:

The invention provides an OLED display panel, in which a metal wiring is designed into a first metal layer and a second metal layer. The first metal layer is distributed on an edge of a display area and a bending area, the second metal layer is positioned in the bending area, and a part of the first metal layer positioned in the bending area is electrically connected in parallel or in series with the second metal layer to form a double-layer wiring or a double-layer wiring exchange structure. After any one of the first metal layer or the second metal layer breaks, the other metal layer can still be used to maintain signal transmission, which reduces a risk of signal transmission failure caused by long-term bending of signal wiring. This can improve yield of the OLED display panel while solving a problem of unstable connection of power supply wirings, scan wirings, and data wirings in the bending area. Therefore, stability of a TFT device and display quality of the display panel are improved.

As described above, although the present invention has been disclosed as above with preferred embodiments, the above preferred embodiments are not intended to limit the present invention. Those skilled in the art can make various modifications and retouching without departing from the spirit and scope of the present invention. Therefore, the protection scope of the present invention is subject to the scope defined by the claims.

What is claimed is:

1. An organic light-emitting diode (OLED) display panel, comprising:
    a substrate, a thin-film transistor (TFT) layer disposed on one side of the substrate, a light-emitting layer disposed on the TFT layer, and an encapsulation layer covering the light-emitting layer, wherein the OLED display panel comprises a display area and a bending area positioned on one side of the display area;
    wherein a first metal layer, a second metal layer, and a dielectric layer between the first metal layer and the second metal layer are disposed on the TFT layer corresponding to the bending area, and a partial region of the first metal layer is electrically connected to the second metal layer;
    wherein the display area close to the bending area is provided with a first connection block and a second connection block, the first connection block and the second connection block are both electrically connected to the first metal layer, and wherein the first connection block and a first gate are positioned in a same layer, and the second connection block and a second gate are positioned in a same layer.

2. The OLED display panel according to claim 1, wherein a counterbore is disposed between the first metal layer and the substrate, and the counterbore is filled with an organic insulating material.

3. The OLED display panel according to claim 1, wherein the second metal layer is disposed opposite to the first metal layer, and the second metal layer is electrically connected to the first metal layer through a via-hole in the dielectric layer.

4. The OLED display panel according to claim 1, wherein the first metal layer comprises a plurality of first sub-metal layers disposed separately, the second metal layer comprises a plurality of second sub-metal layers disposed separately, each of the second sub-metal layers is respectively opposite to an interval between correspondingly adjacent first sub-metal layers, and each of the second sub-metal layers is respectively electrically connected to the correspondingly adjacent first sub-metal layers through a via-hole in the dielectric layer.

5. The OLED display panel according to claim 3, wherein the first metal layer and a source/drain of the display area are positioned in a same layer, the second metal layer and a second gate or a first gate of the display area are positioned in a same layer, and the dielectric layer is an organic insulating material.

6. The OLED display panel according to claim 3, wherein the first metal layer and the source/drain are positioned in a same layer, the second metal layer and an anode of the display area are positioned in a same layer, and the dielectric layer is a planarization layer.

7. The OLED display panel according to claim 3, wherein the first metal layer and a first gate are positioned in a same layer, the second metal layer and a second gate are positioned in a same layer, and the dielectric layer is an organic insulating material.

8. The OLED display panel according to claim 1, wherein the first metal layer is disposed on a neutral plane with minimal bending stress when bending, formed by the substrate and the encapsulation layer in the bending area.

9. A display device, comprising the OLED display panel according to claim 1.

\* \* \* \* \*